United States Patent
Liao et al.

(10) Patent No.: US 11,550,233 B2
(45) Date of Patent: Jan. 10, 2023

(54) LITHOGRAPHY SYSTEM AND OPERATION METHOD THEREOF

(71) Applicant: TAIWAN SEMICONDUCTOR MANUFACTURING CO., LTD., Hsinchu (TW)

(72) Inventors: Chi-Hung Liao, New Taipei (TW); Min-Cheng Wu, Taitung County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 721 days.

(21) Appl. No.: 16/410,426

(22) Filed: May 13, 2019

(65) Prior Publication Data

US 2020/0057364 A1 Feb. 20, 2020

Related U.S. Application Data

(60) Provisional application No. 62/718,936, filed on Aug. 14, 2018.

(51) Int. Cl.
*G03F 7/20* (2006.01)
*H05G 2/00* (2006.01)

(52) U.S. Cl.
CPC ...... *G03F 7/70916* (2013.01); *G03F 7/70033* (2013.01); *H05G 2/005* (2013.01)

(58) Field of Classification Search
CPC ............ G03F 7/70033; G03F 7/70916; H05G 2/003–008
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2003/0223541 A1 | 12/2003 | Petach et al. |
| 2006/0011864 A1 | 1/2006 | Koshelev et al. |
| 2006/0024216 A1 | 2/2006 | Hergenhan et al. |
| 2007/0170377 A1 | 7/2007 | Nakano |

(Continued)

FOREIGN PATENT DOCUMENTS

| | | |
|---|---|---|
| CN | 1721999 A | 1/2006 |
| CN | 101687102 A | 3/2010 |

(Continued)

*Primary Examiner* — Steven Whitesell Gordon
(74) *Attorney, Agent, or Firm* — Maschoff Brennan

(57) ABSTRACT

A method including steps as follows is provided. A primary droplet and a satellite droplet are shot toward an excitation zone. The satellite droplet is deflected away from the excitation zone. A laser beam is emitted toward the excitation zone to excite the primary droplet to generate an extreme ultraviolet (EUV) light. The EUV light is directed onto a reticle using a first optical reflector, such that the EUV light is imparted with a pattern of the reticle. The EUV light with the pattern is directed onto a wafer using a second optical reflector.

20 Claims, 9 Drawing Sheets

(56) References Cited

U.S. PATENT DOCUMENTS

| | | | |
|---|---|---|---|
| 2008/0067456 A1 | 3/2008 | Kloepfel et al. | |
| 2009/0014668 A1 | 1/2009 | Vaschenko | |
| 2009/0230326 A1* | 9/2009 | Vaschenko | H05G 2/008 250/492.2 |
| 2012/0280149 A1 | 11/2012 | Mestrom et al. | |
| 2013/0015373 A1 | 1/2013 | Yakunin et al. | |
| 2014/0001369 A1* | 1/2014 | Nishisaka | G03F 7/70033 250/504 R |
| 2014/0034759 A1* | 2/2014 | Yabu | H05G 2/003 239/708 |
| 2016/0054663 A1* | 2/2016 | Kleemans | H05G 2/003 250/504 R |
| 2016/0227638 A1* | 8/2016 | Hori | H05G 2/008 |
| 2017/0019981 A1 | 1/2017 | Shen et al. | |
| 2018/0084630 A1* | 3/2018 | Brandstätter | H05G 2/003 |
| 2020/0363729 A1* | 11/2020 | Yanagida | H05G 2/003 |

FOREIGN PATENT DOCUMENTS

| | | |
|---|---|---|
| CN | 102696283 A | 9/2012 |
| TW | 201202867 A | 1/2012 |
| WO | 2015139900 A1 | 9/2015 |

\* cited by examiner

LITHOGRAPHY SYSTEM AND OPERATION METHOD THEREOF

PRIORITY CLAIM AND CROSS-REFERENCE

This application claims priority to U.S. Provisional Application Ser. No. 62/718,936, filed Aug. 14, 2018, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
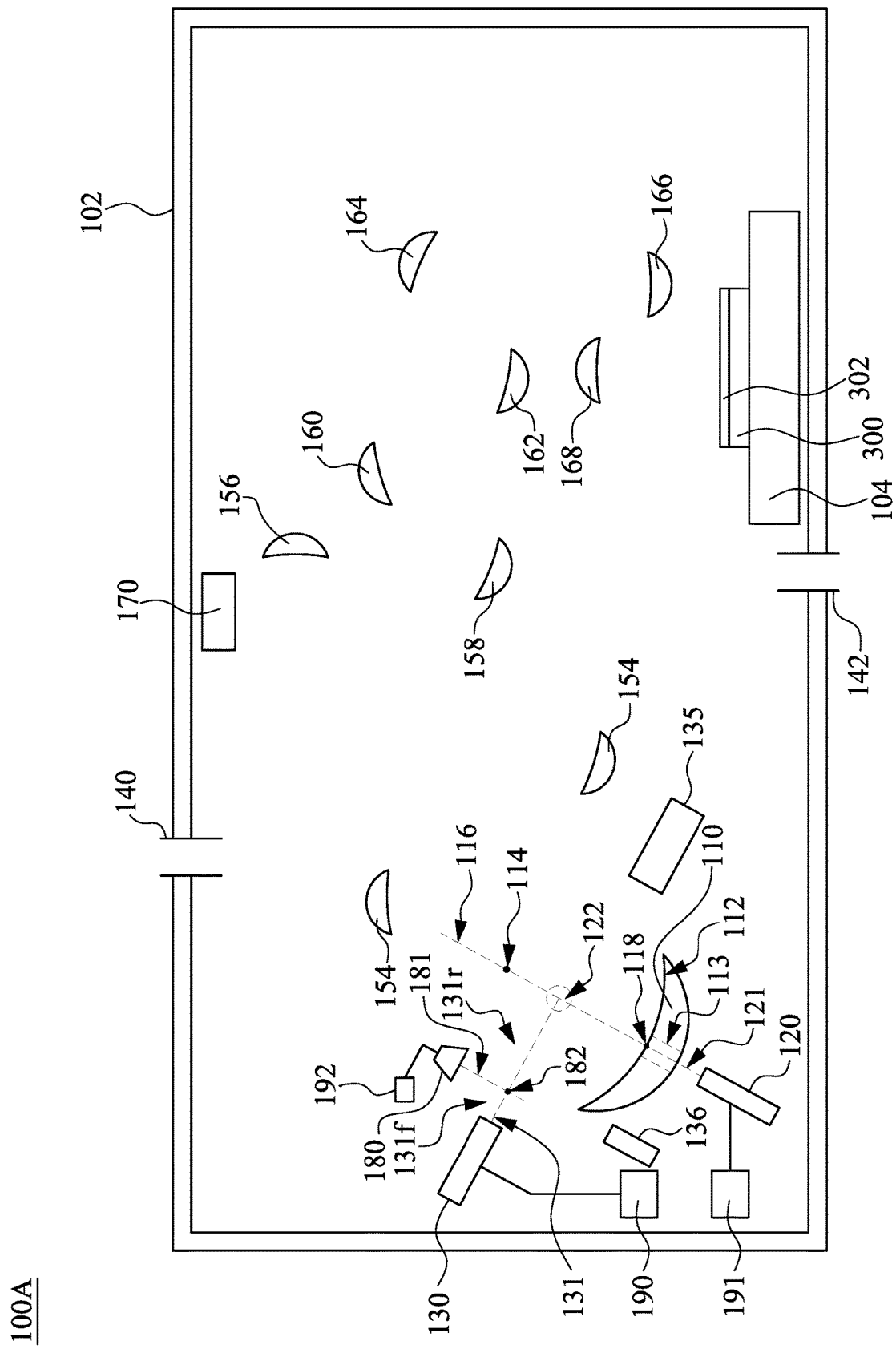
FIG. 1 illustrates a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 illustrates a lithography system 100A according to some embodiments of the present disclosure. The lithography system 100A includes a chamber 102, a collector 110, a laser generator 120, a droplet generator 130, a droplet catcher 135, an inlet port 140, an outlet port 142, optical reflectors 152, 154, 156, 158, 160, 162, 164, 166, 168, a reticle 170, a droplet deflector 180, and controllers 190, 191 and 192. The lithography system 100A is an extreme ultraviolet (EUV) exposure tool that can perform an exposure operation for exposing a photoresist layer 302 coated on a wafer 300 within the chamber 102. For example, the lithography system 100A may include a stepper 104 disposed within the chamber 102, and the wafer 300 on which the photoresist layer 302 is coated is mounted on the stepper 104. The stepper 104 is movable in the chamber 102 and is configured to shift the wafer 300, such that the wafer 300 can be shifted at a suitable position for the exposing.

The collector 110 is disposed within the chamber 102. In some embodiments, the collector 110 is mounted to a support (not shown in FIG. 1) that is a part of the lithography system 100A. The collector 110 has a concave mirror surface 112. The concave mirror surface 112 of collector 110 may have a focal point 114 and an axis of symmetry 116 which can serve as an optical axis of the collector 110. In greater detail, the axis of symmetry 116 of the collector 110 connects a center 118 of the mirror surface 112 and the focal point 114.

In some embodiments, the mirror surface 112 of the collector 110 can also be a multilayer reflector of any suitable structure and composition. The mirror surface 112 can include a distributed Bragg reflector formed from alternating layers of a high index of refraction material and a low index of refraction material. For example, the alternating layers can be Mo and Si or Mo and Be. In some embodiments, the mirror surface 112 includes more than 20 pairs of alternating layers. In some embodiments, the mirror surface 112 obtains a reflectivity greater than 60%. In some embodiments, the uppermost layer of the mirror surface 112 can be protected from oxidation by a capping layer, such as a layer of Ru. In some embodiments, the mirror surface 112 has an opening 113 through the center 118 of the mirror surface 112, and the opening 113 can be provided to allow passage of a light beam propagated from a back side of the collector 110.

The laser generator 120 is disposed within the chamber 102 and at the back side of the collector 110, and thus the mirror surface 112 of the collector 110 faces away from the laser generator 120. The laser generator 120 is configured to provide a laser beam. The laser generator 120 can be oriented such that the laser beam emitted from the laser generator 120 can go along the axis of symmetry 116 of the mirror surface 112. Stated differently, the laser generator 120 is oriented such that an optical path 121 of the laser generator 120 is the same as the axis of symmetry 116 of the mirror surface 112. The laser generator 120 is configured to generate a laser beam traveling along the optical path 121 of the laser generator 120 and aiming at an excitation zone 122 in front of the mirror surface 112 of the collector 110. In some embodiments, the laser beam generated by the laser generator 120 is focused on the excitation zone 122. In some embodiments, the excitation zone 122 may be between the center 118 and the focal point 114 of the mirror surface 112. The laser generator 120 may emit a laser beam from the back side to a front side of the collector 110 through the opening 113 of the collector 110. In some embodiments, the laser generator 120 includes a laser source, such as a pulse carbon dioxide ($CO_2$) laser source.

The droplet generator 130 and the droplet catcher 135 are disposed within the chamber 102 and on two opposite sides of the collector 110 (e.g., a left side and a right side of the collector 110). The droplet generator 130 is configured to provide droplets. The droplet generator 130 can be oriented such that the droplets shot from the droplet generator 130 can go along a droplet path 131 (i.e. an initial path for the droplets) through the excitation zone 122 (i.e., the position on which the laser beam generated by the laser generator 120 is focused on) in front of the mirror surface 112 of the collector 110. Stated differently, the droplet path 131 intersects with the axis of symmetry 116 of the mirror surface 112 at the excitation zone 122. Furthermore, because the optical path 121 of the laser generator 120 is the same as the axis of symmetry 116 of the mirror surface 112, the droplet path 131 intersects with the optical path 121 of the laser generator 120 at the excitation zone 122 as well. As shown in FIG. 1, when the droplet deflector 180 is turned on, a rear segment 131r of the droplet path 131 will be non-parallel with a front segment 131f of the droplet path 131. For example, the front segment 131f of the droplet path 131 is substantially linear and perpendicular to the outlet of the droplet generator 180, but the rear segment 131r of the droplet path 131 is slightly tilted toward the collector 110 because droplets will be deflected by the droplet deflector 180, which will be described in greater detail below.

The droplet catcher 135 is configured to catch the droplets from the droplet generator 130. In some embodiments, example materials shot from the droplet generator 130 may include tin or other suitable material that can be used to generate EUV. In some embodiments, the pulses of the laser beam provided by the laser generator 120 and the droplet generating rate of the droplet generator 130 are controlled to be synchronized such that the droplets receive peak powers consistently from the laser pulses of the laser beam. In some embodiments, the laser generator 120 and the droplet generator 130 can be collectively operated to generate EUV light, and therefore the laser generator 120 in combination with the droplet generator 130 can serve as an EUV light source.

The inlet port 140 and the outlet port 142 pass sidewalls of the chamber 102 and are coupled to the inside of the chamber 102. In some embodiments, the inlet port 140 and the outlet port 142 are configured to provide a continuous gas flow through the chamber 102 during the operation of the lithography system 100A, so as to protect the collector 110 from contaminations, such as tin particles (e.g., tin debris).

The optical reflectors 152, 154, 156, 158, 160, 162, 164, 166, 168 are within the chamber 102 and are mounted to respective supports (not shown in FIG. 1) that are parts of the lithography system 100A. The optical reflectors 152, 154, 156 are optically coupled between the collector 110 and the reticle 170, and the optical reflectors 158, 160, 162, 164, 166, 168 are optically coupled between the reticle 170 and the photoresist layer 302 on the wafer 300. The optical reflector 152 is optically coupled to the collector 110, and thus the mirror surface 112 of the collector 110 can reflect a light beam to the optical reflector 152. Afterward, the light beam can be reflected from the optical reflector 152 to the reticle 170 through reflection by the optical reflectors 154, 156. The optical reflector 158 is optically coupled to the reticle 170, and thus the light beam can be reflected from the reticle 170 to the optical reflector 158. Thereafter, the light beam can be reflected from the optical reflector 158 to the photoresist layer 302 through reflection by the optical reflectors 160, 162, 164, 166, and 168.

In some embodiments, the optical reflectors 152, 154, 156, 158, 160, 162, 164, 166, 168 are mirrors which respectively have reflection surfaces. In some embodiments, the optical reflectors 152, 154, 156, 158 can be multilayer structures that operate as distributed Braggs reflectors. The thickness of the layers can be optimized for each of the optical reflectors 152, 154, 156, 158 with respect to wavelength and angle of an incident light beam. In some embodiments, a first group of the optical reflectors 152, 154, 156, 158, 160, 162, 164, 166, 168 includes at least one concave mirror, and a second group of the optical reflectors 152, 154, 156, 158, 160, 162, 164, 166, 168 includes at least one convex mirror.

The reticle 170 can be used to impart the light beam with a pattern thereof so as to create a pattern in the photoresist layer 302. It is noted that the pattern imparted to the light beam may not exactly correspond to the desired pattern in the wafer, for example if the pattern includes phase-shifting features. Generally, the pattern imparted to the light beam will correspond to a particular functional layer in a device being created in the wafer, such as an integrated circuit. In some embodiments, the reticle 170 may include a distributed Bragg reflector. In some embodiments, the reticle 170 may include phase shifting layers and/or absorber layers to define the pattern. In some embodiments, the reticle 170 is an absorberless phase-shifting mask.

The droplet deflector 180 is disposed within the chamber 102, and the collector 110 and the droplet deflector 180 are on two opposite sides of the droplet path 131 of the droplet generator 130 (e.g., an upward side and a downward side of the droplet path 131 of the droplet generator 130). In some embodiments, the droplet deflector 180 provides an airflow toward the droplet path 131 to apply a force on the droplet path 131. In some embodiments, the droplet deflector 180 applies sonic wave toward the droplet path 131 to apply a force on the droplet path. For example, the droplet deflector 180 is a wave generator providing a wave, such as, a sound wave (e.g., vibrations in pressure, particle of displacement, or particle propagation), a vibration wave, or combinations thereof. The droplet deflector 180 can be oriented such that the airflow or the wave provided from the droplet deflector 180 can travel along a traveling path 181 to a second position 182 in the droplet path 131 and between the droplet generator 130 and the excitation zone 122. Stated differently, the traveling path 181 intersects with the droplet path 131 of the droplet generator 130 at the second position 182, and thus provides the airflow or the wave along the traveling path 181 to the second position 182.

The airflow or the wave provided by the droplet deflector 180 may deflect at least one droplet in the traveling path 181. For example, in some embodiments, the droplet deflector 180 is a wave generator that can produce high intensity sound waves traveling along the traveling path 181, and droplets passing through the traveling path 181 may be deflected by the pressure gradients of the high intensity sound waves. In some embodiments, the droplet deflector 180 can produce high intensity sound waves traveling along the traveling path 181 when the droplet generator 130 shoots droplets along the droplet path 131, and thus the droplets at the second position 182 may be deflected by the pressure gradients of the high intensity sound waves, due to the intersection of the droplet path 131 and the traveling path 181. In some other embodiments, the droplet deflector 180 can supply an airflow traveling along the traveling path 181 when the droplet generator 130 shoots droplets along the droplet path 131, and thus the droplets at the second position 182 may be deflected by the pressure gradients of the airflow, due to the intersection of the droplet path 131 and the traveling path 181.

The controller 190 is electrically connected the droplet generator 130 and is configured to trigger the droplet shooting operation of the droplet generator 130. In some embodiments, the controller 190 can be configured to halt the droplet shooting operation of the droplet generator 130. In some embodiments, after the droplet shooting operation of the droplet generator 130 is halted, the controller 190 can also be configured to resume the droplet shooting operation of the droplet generator 130.

The controller 191 is electrically connected the laser generator 120 and is configured to trigger the laser emission operation of the laser generator 120. In some embodiments, the controller 191 can be configured to halt the laser emission operation of the laser generator 120. In some embodiments, after the laser emission operation of the laser generator 120 is halted, the controller 191 can also be configured to resume the laser emission operation of the laser generator 120.

The controller 192 is electrically connected to the droplet deflector 180 and is configured to trigger the force applying operation of the droplet deflector 180. In some embodiments, the controller 190 is configured to halt the force applying operation of the droplet deflector 180. In some embodiments, after the force applying operation is halted, the controller 190 can be configured to resume the force applying operation of the droplet deflector 180.

In some embodiments, the controllers 190 and 192 can be programmed such that the controller 190 can trigger the droplet shooting operation before the controller 192 triggers the force applying operation. In some embodiments, the controllers 190 and 192 can be programmed such that the controller 190 can trigger the droplet shooting operation after the controller 192 triggers the force applying operation. In some embodiments, the controllers 190 and 192 can be programmed such that the controller 190 can halt the droplet shooting operation before the controller 192 halts the force applying operation.

In some embodiments, the controllers 190 and 191 can be programmed such that controller 190 can trigger the droplet shooting operation before the controller 191 triggers the laser emission operation. In some embodiments, the controllers 190 and 191 can be programmed such that the controller 190 can trigger the droplet shooting operation after the controller 191 triggers the laser emission operation. In some embodiments, the controllers 190 and 191 can be programmed such that the controller 190 can halt the droplet shooting operation before the controller 191 halts the laser emission operation.

In some embodiments, the laser emission operation, the droplet shooting operation, and the force applying operation are synchronized. For example, the controllers 190, 191 and 192 can be programmed such that the controllers 190, 191 and 192 can synchronously trigger the droplet shooting operation, the laser emission operation, and the force applying operation.

Figure 2:
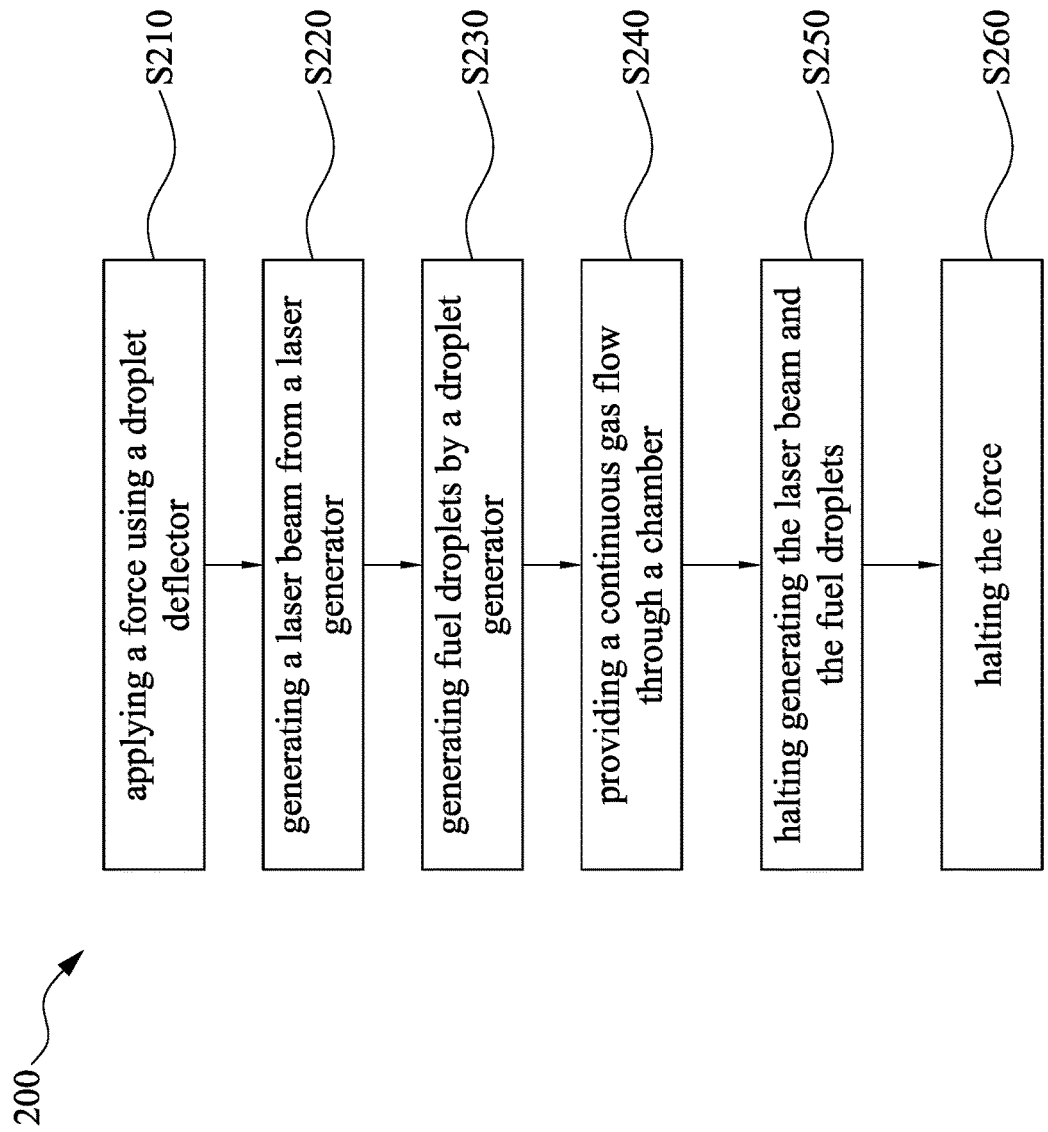
FIG. 2 is a flow chart of a process according to some embodiments of the present disclosure.
Figure 3:
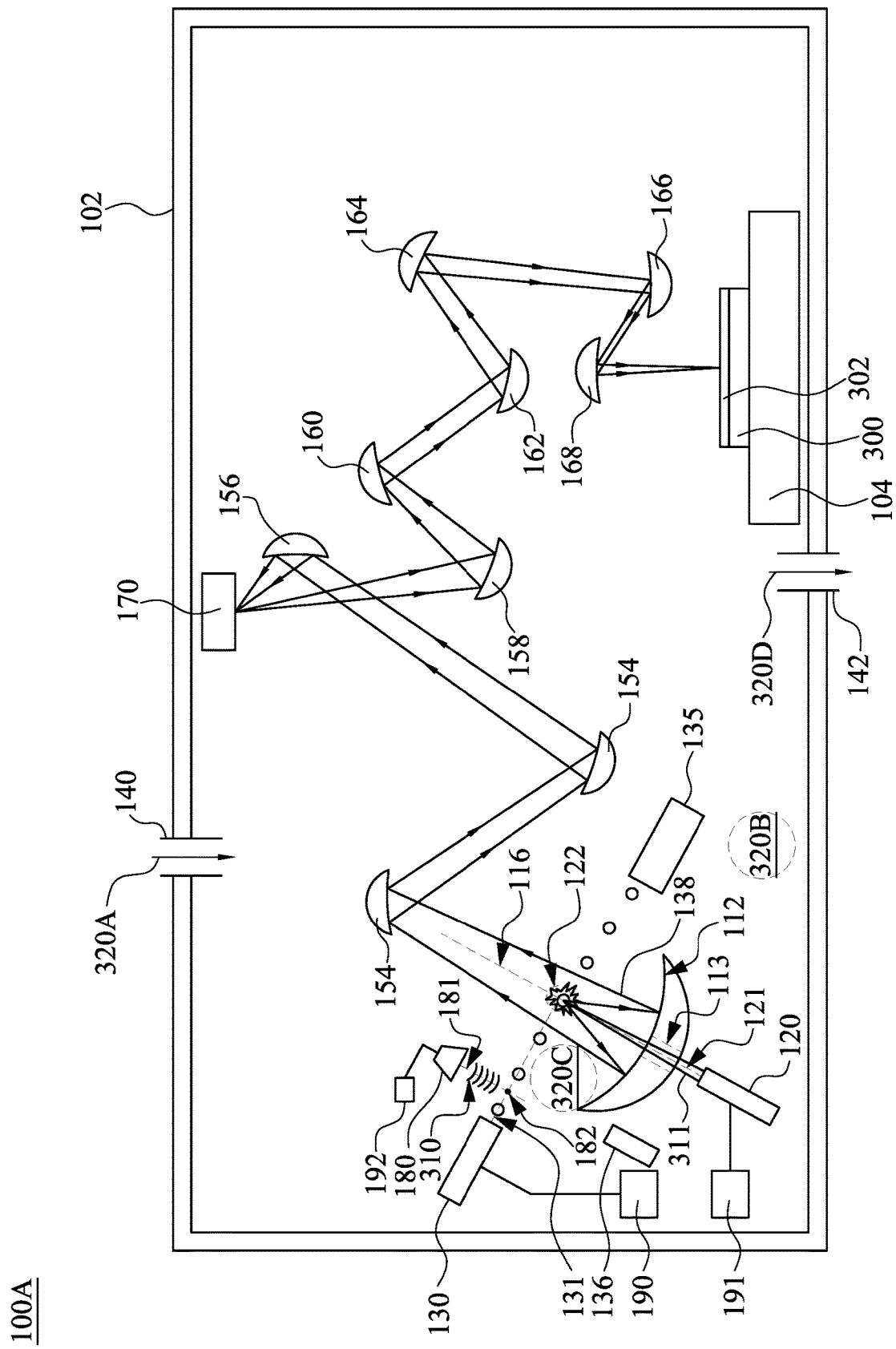
FIG. 3 illustrates the lithography system of FIG. 1 with which the process of FIG. 2 is implemented according to some embodiments of the present disclosure.
Figure 4:
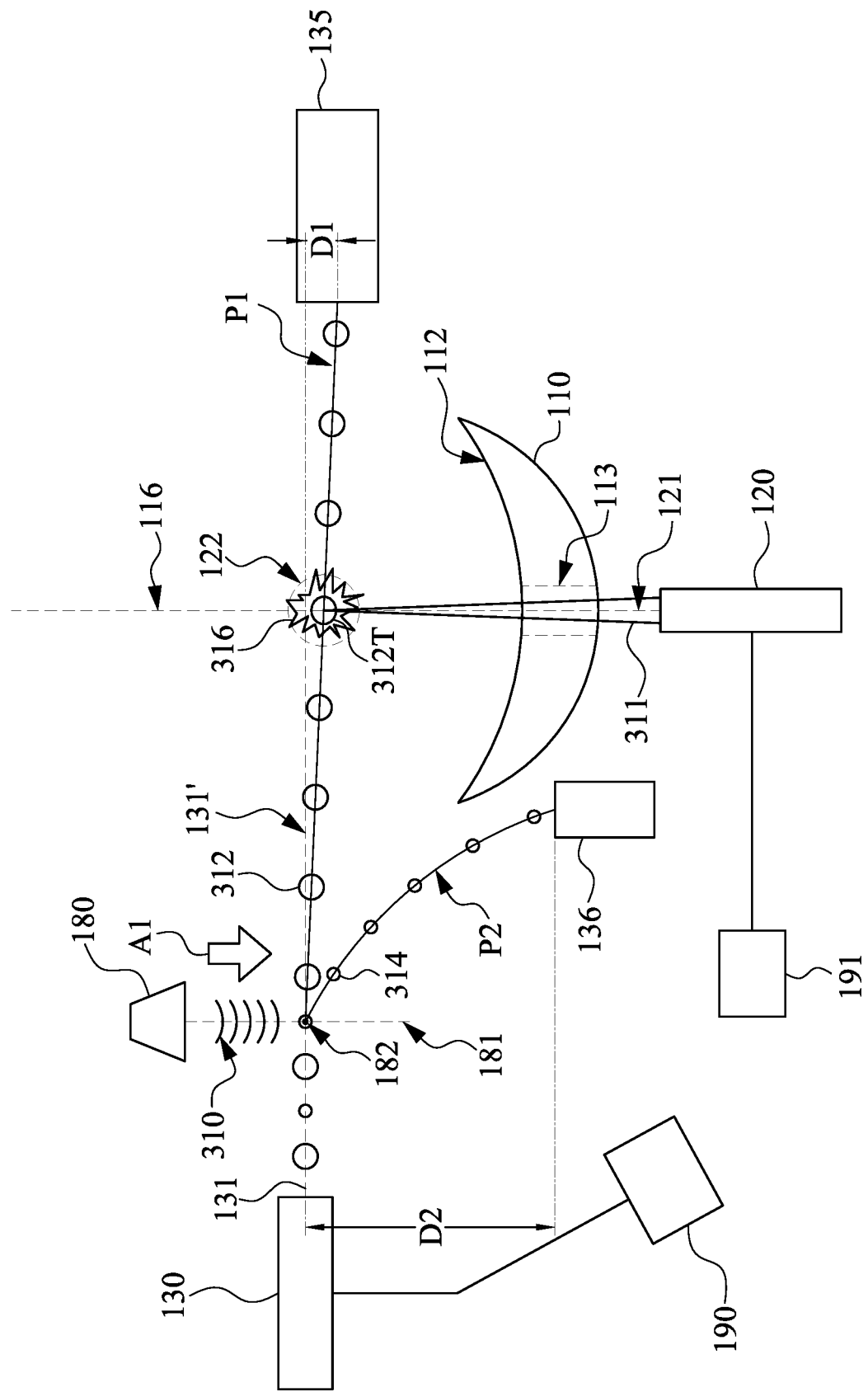
FIG. 4 illustrates a drawing of partial enlargement of the lithography system of FIG. 3.

FIG. 2 is a flow chart of a process 200 according to some embodiments of the present disclosure. FIG. 3 illustrate the lithography system 100A of FIG. 1 with which the process 200 of FIG. 2 is implemented according to some embodiments of the present disclosure. FIG. 4 illustrates a drawing of partial enlargement of the lithography system 100A of FIG. 3. The process 200 includes actions S210, S220, S230, S240, S250, and S260. The lithography system 100A can be operated to expose a photoresist layer coated on a wafer by the process 200. For example, as shown in FIG. 3, the wafer 300 on which the photoresist layer 302 is coated is mounted on the stepper 104 within the chamber 102, and the lithography system 100A is operated to expose the photoresist layer 302 coated on the wafer 300.

The action S210 is applying a force using the droplet deflector. For example, as shown in FIGS. 3 and 4, the controller 192 can trigger a force applying operation such that the droplet deflector 180 can produce a force along the traveling path 181 toward the second position 182. In some embodiments, the force may be applied using a sound wave. In some embodiments, the sound wave has a frequency less than 20 Hz and thus can be referred to as an infrasound wave. In some embodiments, the sound wave has a frequency greater than 20000 Hz and thus can be referred to as an ultrasound wave. In some embodiments, the droplet deflector 180 can produce forces using other techniques, such as pressure wave, vibration wave, and/or electromagnetic wave.

The action S220 is generating a laser beam from a laser generator. For example, as shown in FIGS. 3 and 4, the controller 190 can be programmed to trigger a laser emission operation such that the laser generator 120 can generate a laser beam 311. As previously described, the laser generator 120 can be oriented such that the laser beam 311 emitted from the laser generator 120 can go along the axis of symmetry 116 of the mirror surface 112, and the laser generator 120 is configured to generate the laser beam 311 aiming at the excitation zone 122 in front of the mirror surface 112 of the collector 110. As such, the laser beam 311 can be sent to the excitation zone 122 in the axis of symmetry 116 of the mirror surface 112. In some embodiments, the laser beam 311 generated by the laser generator 120 is propagated through the opening 113 and focused in the excitation zone 122.

The action S230 is generating fuel droplets by a droplet generator. For example, as shown in FIGS. 3 and 4, the controller 190 can trigger a droplet shooting operation such that fuel droplets 312 (e.g., droplets of molten tin) are generated by the droplet generator 130. In some embodiments, the fuel droplets 312 may include tin or other suitable materials that can be used to generate EUV. The fuel droplets 312 are generated by the droplet generator 130 to form a stream of the fuel droplets 312 directed along the droplet path 131 and toward the excitation zone 122.

Together with the fuel droplets 312 there may also be generated very small fuel fragments referred to as satellite droplets 314 that result from incomplete coalescence of the primary fuel droplets 312, as illustrated in FIG. 4. By way of example, a fuel droplet may have a diameter of about 30-50 microns whereas a satellite droplet may have a diameter of 6-10 microns. The satellite droplets 314 may lead to a negative impact on the EUV generation. For example, if a satellite droplet 314 and a neighboring fuel droplet 312 travel along an undeflected droplet path 131' into the excitation zone 122 together, the laser beam might excite the satellite droplet 314 and thus lead to a shock wave. This shock wave might accelerate the neighboring fuel droplet 312 to move away from the excitation zone 122, which in turn would result in incomplete excitation of the fuel droplet 312.

However, in some embodiments of the present disclosure, because the droplet deflector 180 applies a force along the traveling path 181 to the second position 182 between the excitation zone 122 and the droplet generator 130, the fuel droplets 312 and the satellite droplets 314 can be deflected from the undeflected path 131'. Moreover, because the satellite droplets 314 have lighter weights than the fuel droplets 132, the satellite droplets 314 can be deflected by greater distances than that the fuel droplets 132 are deflected by. Therefore, the fuel droplets 312 and the deflected satellite droplets 314 will move along different paths P1 and P2. In greater detail, the path P1 along which the deflected fuel droplets 312 move intersects with the excitation zone 122, but the path P2 along which the deflected satellite droplets 314 move does not intersect with the excitation zone 122. Stated differently, the deflected fuel droplets 312 will pass through the excitation zone 122, but the deflected satellite droplets 314 will not move into the excitation zone 122. In this way, shock waves resulting from excitation of the satellite droplets 314 will be reduced, which in turn will prevent acceleration of the fuel droplets 312 in the excitation zone 122 resulting from the shock waves, thus preventing the fuel droplets 312 from incomplete excitation. Moreover, due to absence of accelerating the fuel droplets 312 by the shock waves, the fuel droplets 312 may pass through the excitation zone 122 at a substantially constant speed.

In some embodiments, the droplets (e.g., the fuel droplets 312 and the satellite droplets 314) are shot out by the droplet generator 130 after turning on the droplet deflector 180, so that undeflected satellite droplets 314 can be reduced. The asynchronous turn-on operations of the droplet generator 130 and the droplet deflector 180 can be achieved by the individual controllers 190 and 192. For example, the controller 190 triggers the droplet shooting operation after the controller 192 triggers the force applying operation.

In some embodiments, the droplet deflector 180 is turned off after stopping shooting the droplets (e.g., the fuel droplets 312 and the satellite droplets 314), so that undeflected satellite droplets 314 can be reduced. The asynchronous turn-off operations of the droplet generator 130 and the droplet deflector 180 can be achieved by the individual controllers 190 and 192. For example, the controller 190 halts (i.e., stops) the droplet shooting operation before the controller 192 halts (i.e., stops) the force applying operation.

The deflected fuel droplets 312 goes toward the excitation zone 122 which is at the focus of the laser beam 311, so that the fuel droplets 312 are vaporized by the laser beam 311 to form an EUV-generating plasma. For example, when the laser beam 311 is incident on a fuel droplet 312T, the fuel droplet 312T can be excited, so as to produce high-temperature plasma 316. In some embodiments, the high-temperature plasma 316 may be referred to as a microplasma which can generate EUV light 138, as shown in FIG. 3. In some embodiments, the lithography system 100A produces EUV light 138 with a wavelength in the range from about 3 nm to about 15 nm, for example a wavelength of about 13.5 nm.

In some embodiments, the laser beam 311 is emitted from the laser generator 120 before turning on the droplet generator 130, so that the fuel droplets 312 can be exited. The asynchronous turn-on operations of the droplet generator 130 and the laser generator 120 can be achieved by the individual controllers 190 and 191. For example, the controller 190 triggers the droplet shooting operation after the controller 191 triggers the laser emission operation.

In some embodiments, the deflected fuel droplets 312 moving along the path P1 may be caught by the droplet catcher 135, and the deflection satellite droplets 314 moving along the path P2 may be caught by another droplet catcher 136 which is separated from the droplet catcher 135. The droplet catcher 135 is misaligned with the droplet generator 130 for catching the deflected primary droplets 312. In some embodiments, the collector 110 is located between the droplet catchers 135 and 136. For example, the satellite droplet catcher 136 is disposed behind the collector 110, because the satellite droplets 314 are deflected toward a back side of the collector 110. On the other hand, the fuel droplet catcher 135 is disposed in front of the collector 110, because the fuel droplets 312 still move in front of the collector 110 even if they are deflected by the droplet deflector 180.

In some embodiments, a vertical distance D1 between an outlet of the droplet generator 130 and an entrance of the droplet catcher 135 is a first distance D1, and a vertical distance D2 between the outlet of the droplet generator 130 and an entrance of the minor droplet catcher 136 is a second distance D2 greater than the first distance D1. Either the first distance D1 or second distance D2 is less than or equal to about 30 cm (e.g., in a range from about 20 cm to about 30 cm). The first and second distances D1 and D2 are associated with deflections of the fuel droplets 312 and the satellite droplets 314. For example, the fuel droplets 312 may have a diameter in a range from about 25 μm to about 33 μm and a mass in a range from about $7*10^{-12}$ kg to about $8*10^{-12}$ kg, and the satellite droplets 314 may have a diameter in a range from about 5 μm to about 7 μm and a mass in a range from about $2*10^{-13}$ kg to about $3*10^{-13}$ kg. In such example, The droplet deflector 180 applies a force 310 along the direction A1 to the satellite droplets 314 in a range from about $2.5*10^{-11}$ N to about 3*10-11 N, such that the satellite droplets 314 may be deflected by a desired second distance D2 (e.g., about 30 cm), and the fuel droplets 312 may be deflected by a desired first distance D1 (e.g., about 25 cm). Applying the force 310 may include generating a wave or an airflow along the direction A1.

After generating the EUV light 138 by exciting the fuel droplets 312, the EUV light 138 is reflected by the mirror surface 112 of the collector 110 toward the optical reflector 152, as shown in FIG. 3. In some embodiments, the EUV light 138 is widely scattered to produce the reflected EUV light. The collector 110 can gather the EUV light 138 and direct the EUV light 138 onto the optical reflector 152. The EUV light 138 then can be reflected by the optical reflectors 152, 154, 156 in sequence and to the reticle 170 as illustrated in FIG. 3. The reticle 170 reflects the EUV light 138, which in turn imparts the EUV light 138 with a pattern.

After using the optical reflectors 152, 154, 156 to reflect the EUV light 138 to the reticle 170, a pattern is imparted to the EUV light 138. Thereafter, the EUV light 138 imparted with the pattern is directed to the photoresist layer 302 coated on the wafer 300 by the optical reflectors 158, 160, 162, 164, 166, 168. The lithography system 100A thereby selectively exposes the photoresist layer 302 coated on the wafer 300 in the pattern defined by the reticle 170 (i.e., the pattern imparted to the EUV light 138).

The action S240 is providing a continuous gas flow through a chamber. For example, as shown in FIG. 3, a gas flow including gases 320A, 320B, 320C, and 320D is provided to flow through the chamber 102. The gas 320A is the gas flow as it enters the chamber 102 through the inlet port 140. The gas 320B is the gas flow when it resides within the chamber 102. The gas 320C is a portion of the gas flow that is located in proximity to the mirror surface 112 of the collector 110. The gas 320D is gas flow as it leaves the chamber 102 through outlet port 142. In some embodiments, the continuous gas flow is provided to flow through the chamber 102 in which the collector 110 and other components of the lithography system 100A are enclosed. In some embodiments, concentration of contaminants in the gas 320B can be reduced and the proportion of contaminants carried away with the outflow gas 320D can be increased by raising the flow rate of the gas flow through the chamber 102.

Figure 5:
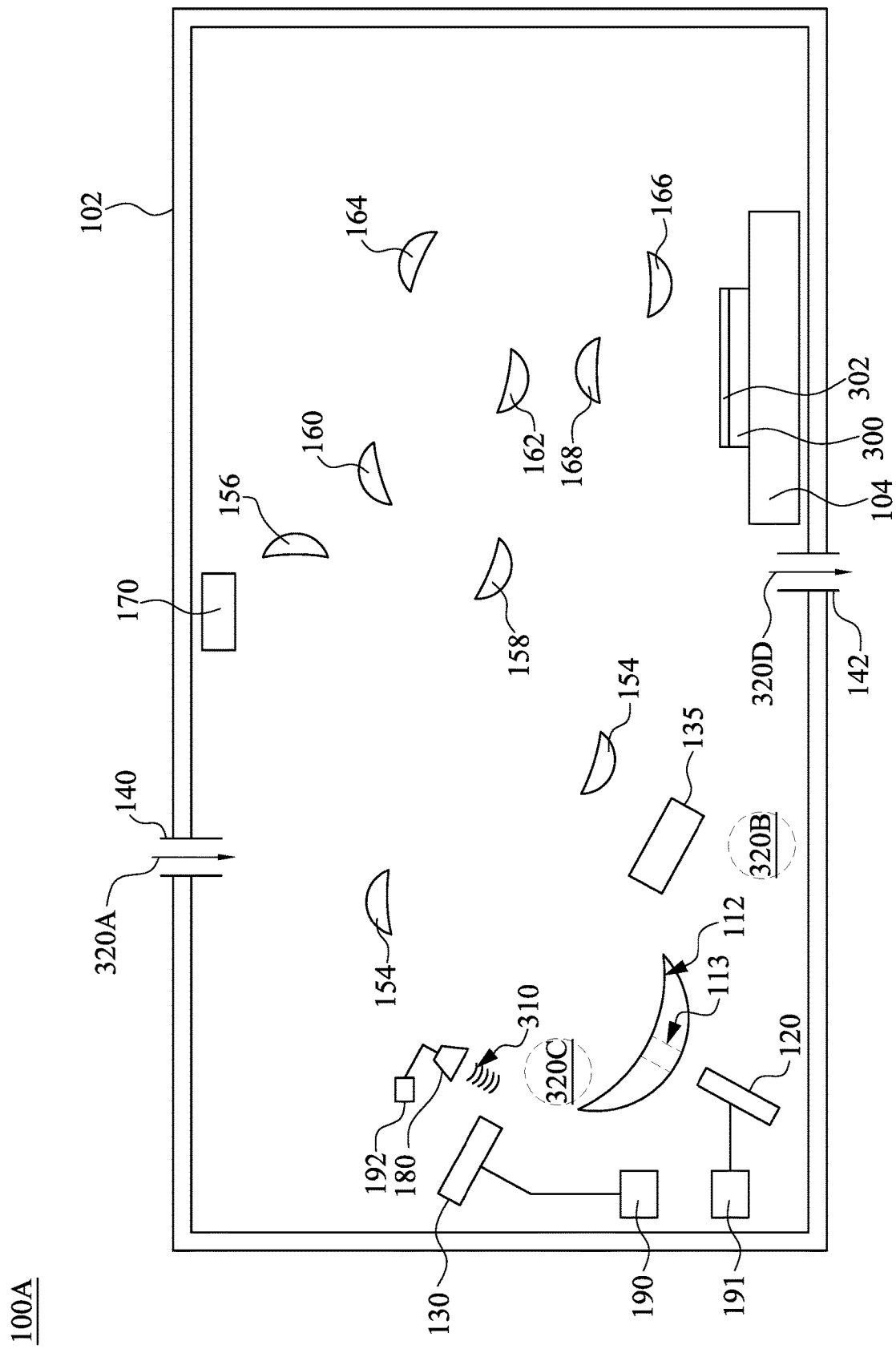
FIG. 5 illustrates the lithography system of FIG. 1 with which the process of FIG. 2 is implemented according to some embodiments of the present disclosure.

Following the actions S210, S220, S230, and S240, the process 200 continues with the action S250 which is halting generating the laser beam and generating the fuel droplets. For example, as shown in FIG. 5, which illustrates the lithography system 100A of FIG. 1 with which the process 200 of FIG. 2 is implemented according to some embodiments of the present disclosure, the controllers 190 and 191 can be programmed to halt the droplet shooting operation and the laser emission operation, and thus halting the generation of the EUV light. In some embodiments, the controllers 190, 191 and 192 are programmed such that the laser emission operation and the droplet shooting operation are halted before halting the force applying operation, so as to reduce variation in the EUV light. After halting the laser emission operation and the droplet shooting operation, the process 200 continues with the action S260 which is halting the force. For example, the controller 192 is programmed to halt the force applying operation after halting the laser emission operation and the droplet shooting operation.

In the example configuration in FIG. 5, halting the force applying operation is performed after halting the laser emission operation and the droplet shooting operation, but is not limited thereto. In other embodiments, the force applying operation is halted before halting the laser emission operation and the droplet shooting operation.

After halting the laser emission operation and the droplet shooting operation, the controllers 190 and 191 can be programmed to resume the laser emission operation and the droplet shooting operation. Similarly, after halting the force applying operation, the controller 192 can be programmed to resume the force applying operation. In some embodiments, after halting the laser emission operation, the droplet shooting operation, and the force applying operation, the laser emission operation and the droplet shooting operation are resumed. The force applying operation can be resumed after resuming the laser emission operation and the droplet shooting operation. In some embodiments, after halting the laser emission operation and the droplet shooting operation and before halting the force applying operation, the laser emission operation and the droplet shooting operation can be resumed.

Figure 6:
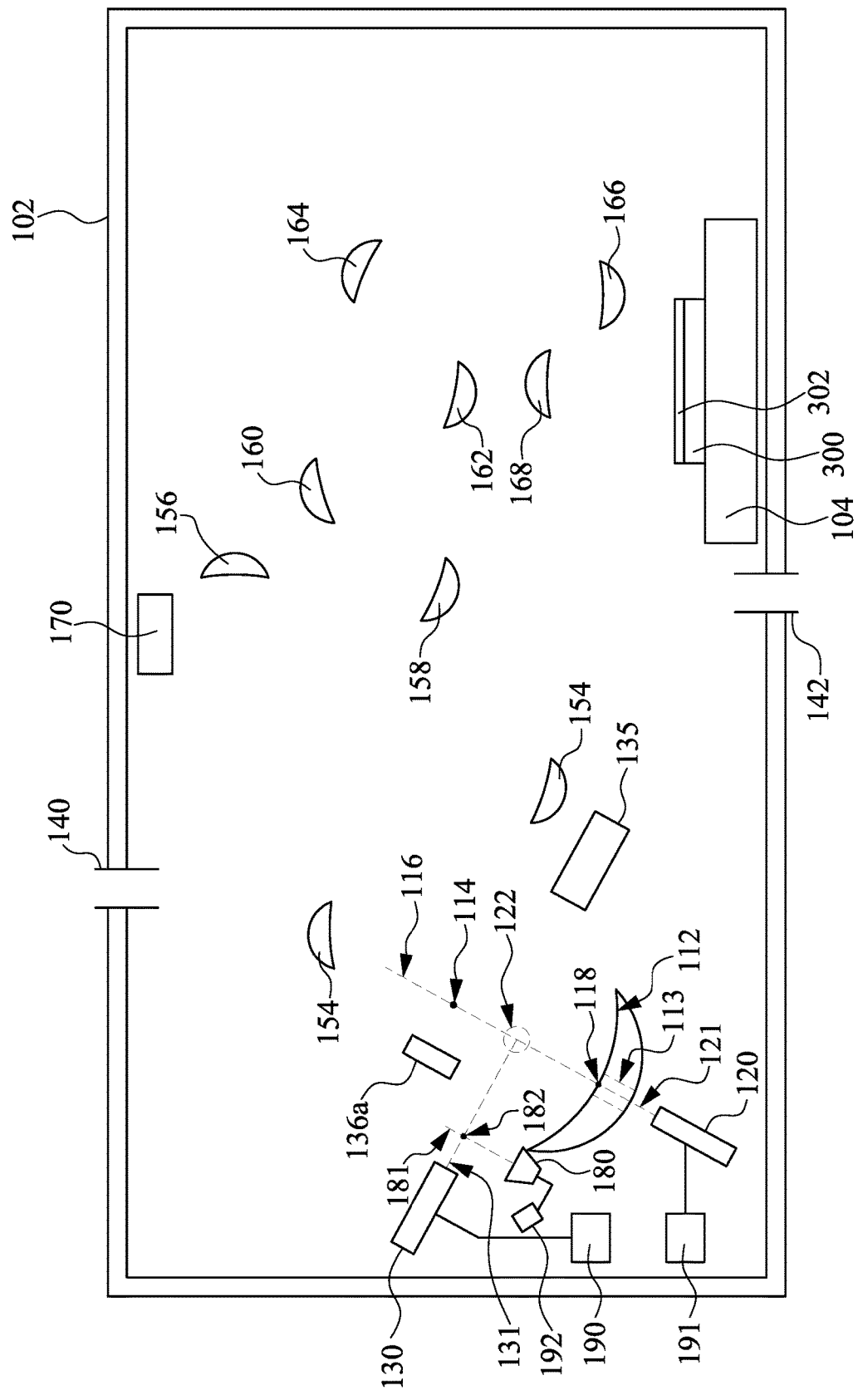
FIG. 6 illustrates a lithography system according to some embodiments of the present disclosure.
Figure 7:
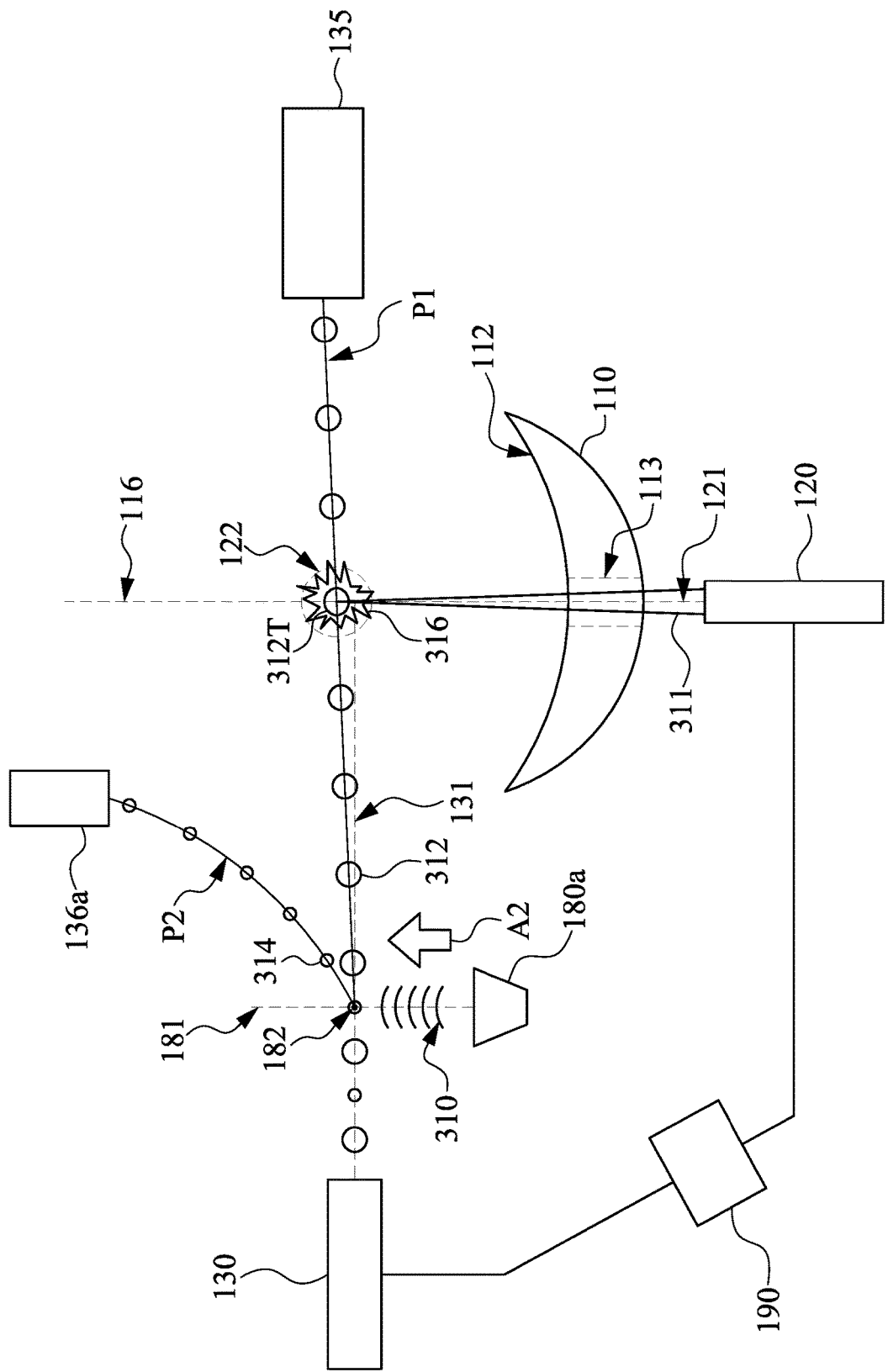
FIG. 7 illustrates a drawing of partial enlargement of the lithography system during operation.

FIG. 6 illustrates a lithography system 100B according to some embodiments of the present disclosure. FIG. 7 illustrates a drawing of partial enlargement of the lithography system 100B during operation. Many aspects of the lithography system 100B are the same as or similar to those of the lithography system 100A as previously described in FIG. 1. For example, the lithography system 100B includes a chamber 102, a collector 110, a laser generator 120, a droplet generator 130, a droplet catcher 135, an inlet port 140, an outlet port 142, optical reflectors 152, 154, 156, 158, 160, 162, 164, 166, 168, a reticle 170, a droplet deflector 180a, and controllers 190, 192, and the detailed explanation may be omitted. The lithography system 100B is an EUV exposure tool that can perform an exposure operation for exposing a photoresist layer 302 coated on a wafer 300 within the chamber 102. For example, the lithography system 100B may include a stepper 104 disposed within the chamber 102, and the wafer 300 on which the photoresist layer 302 is coated is mounted on the stepper 104. The stepper 104 is movable in the chamber 102 and is configured to shift the wafer 300, such that the wafer 300 can be shifted at a suitable position for the exposing.

Different from the lithography system 100A, the collector 110 and the droplet deflector 180a of the lithography system 100B are disposed on the same side of a droplet path 131 of the droplet generator 130. In this way, the droplet deflector 180a can apply a force along a direction A2 away from the collector, so as to deflect the satellite droplets 314 away from the collector 110. As a result, the satellite droplet catcher 136a is disposed in front of the collector 110, so as to catch the deflected satellite droplets 314. In some embodiments, a distance between the droplet catcher 136a and the collector 110 along a direction parallel to the axis of symmetry 116 of the collector 110 is greater than a distance between the excitation zone 122 and the collector 110 along the direction.

Figure 8:
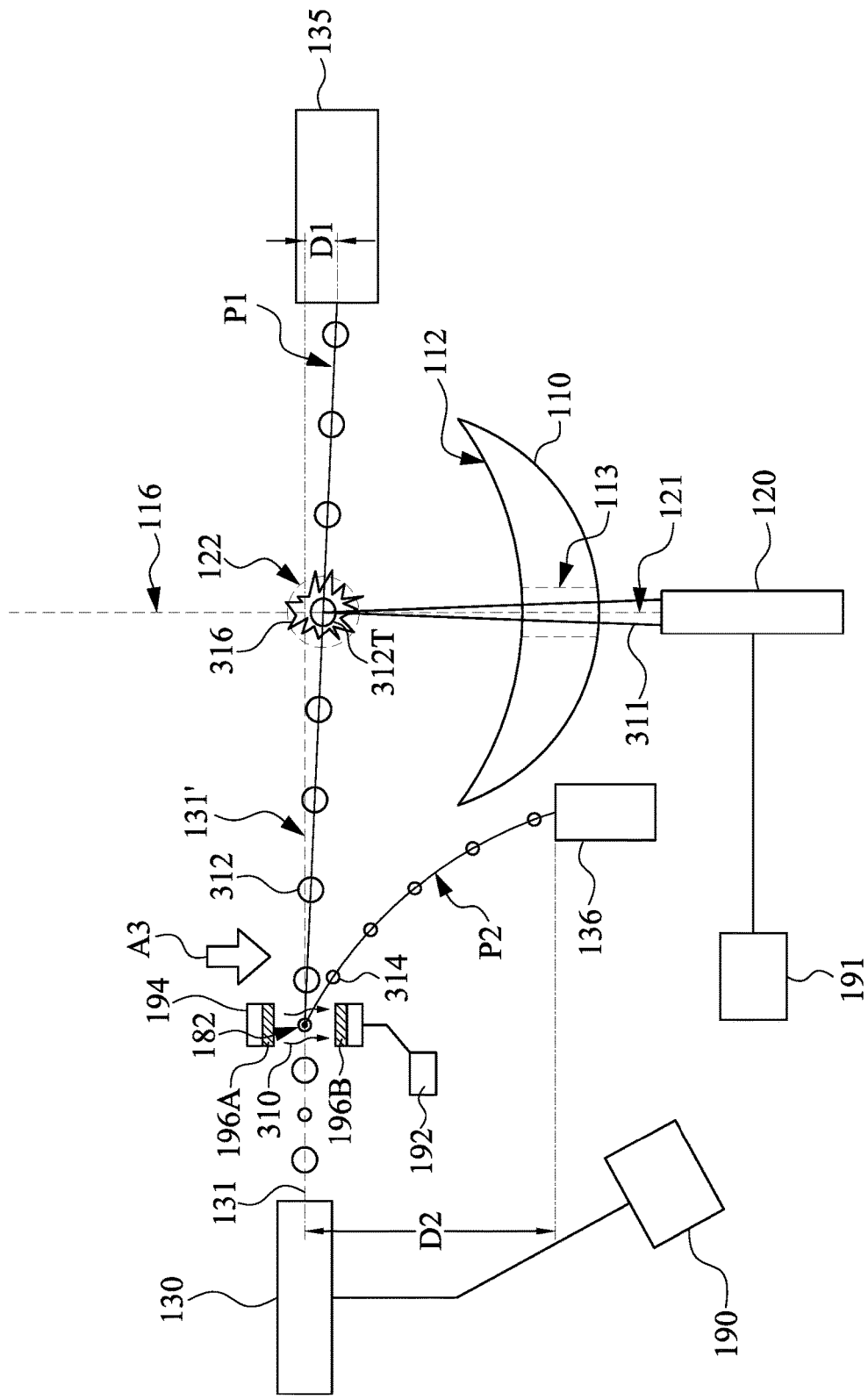
FIG. 8 illustrates a drawing of partial enlargement of a lithography system during operation according to some embodiments of the present disclosure.

FIG. 8 illustrates a drawing of partial enlargement of a lithography system 100C during operation according to some embodiments of the present disclosure. Many aspects of the lithography system 100C are the same as or similar to those of the lithography system 100A as previously described in FIG. 1. For example, the lithography system 100C includes a collector 110, a laser generator 120, a droplet generator 130, a droplet catcher 135, a droplet deflector 194, and controllers 190, 192, and the detailed explanation may be omitted. The lithography system 100C is an EUV exposure tool that can perform an exposure operation, as previously described.

Different from the lithography system 100A, the droplet deflector 194 can generate an electric field on the droplet path 131, so as to deflect the fuel droplets 312 and the satellite droplets 314 from the undeflected path 131' by a force resulted from an electric field, such as Coulomb force. In order to generate an electric field, the droplet deflector 194 may include a pair of electrode plates 196A and 196B which are disposed at opposite sides of the droplet path 131. When a voltage difference is applied to the electrode plates 196A and 196B, an electric field in a direction substantially perpendicular to the droplet path 131 can be generated. For example, a positive voltage is applied to the electrode plate 196A and a negative voltage is applied to the electrode plate 196B, which in turn generates an electric field in a downward direction A3, such that the fuel droplets 312 and the satellite droplets 314 in the electric field can be deflected by a force 310 along the downward direction A3. In this way, as previously described, since the droplet deflector 194 can apply the force 310 along the downward direction A3, it makes the deflected fuel droplets 312 pass through the excitation zone 122 but make the deflected satellite droplets 314 not move into the excitation zone 122.

In some embodiments, the controller 192 electrically connected to the droplet deflector 194 is configured to adjust a voltage difference applied into the electrode plates 196A and 196B, so as to vary an intensity of an electric field generated by the electrode plates 196A and 196B. In some embodiments, the electrode plates 196A and 196B are symmetric about the droplet path 131. In other embodiments, the electrode plates 196A and 196B are asymmetric about the droplet path 131. For example, the electrode plate 196B may be further away from the droplet path 131 than the electrode plate 196A, so as to avoid the fuel droplets 312 and the satellite droplets 314 from hitting the electrode plate 196B.

Figure 9:
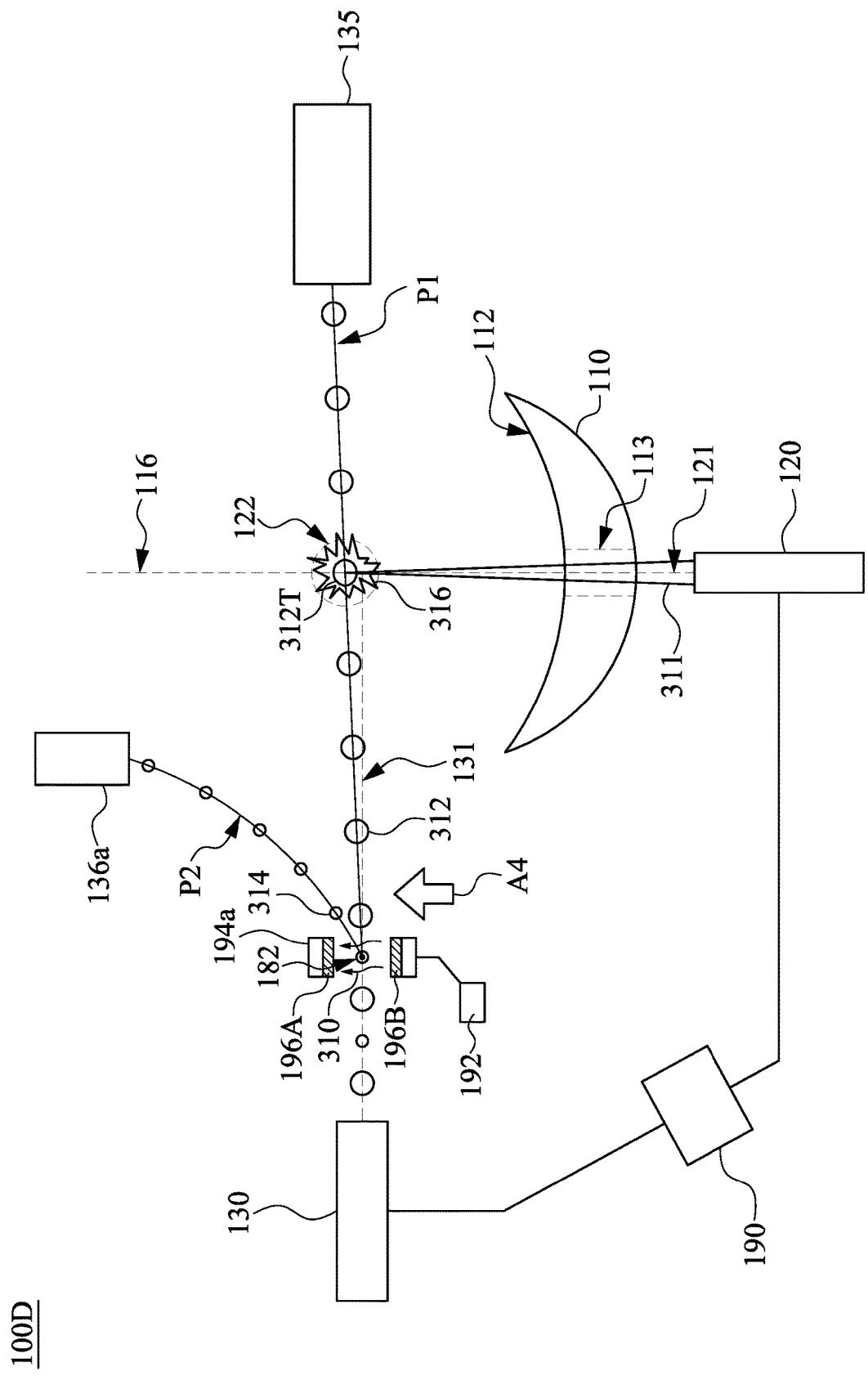
FIG. 9 illustrates a drawing of partial enlargement of a lithography system during operation according to some embodiments of the present disclosure.

FIG. 9 illustrates a drawing of partial enlargement of a lithography system 100D during operation according to some embodiments of the present disclosure. Many aspects of the lithography system 100D are the same as or similar to those of the lithography system 100C as previously described in FIG. 8. For example, the lithography system 100D includes a collector 110, a laser generator 120, a droplet generator 130, a droplet catcher 135, a droplet deflector 194a, and controllers 190, 192, and the detailed explanation may be omitted. The lithography system 100D is an EUV exposure tool that can perform an exposure operation, as previously described.

Different from the lithography system 100C, a voltage difference applied into the electrode plates 196A and 196B of the droplet deflector 194a is inverse to the voltage difference applied into the electrode plates 196A and 196B of the droplet deflector 194 as previously described in FIG. 8, and therefore the droplet deflector 194a can deflect the fuel droplets 312 and the satellite droplets 314 from the undeflected path 131' by a force 310 along an upward direction A4. For example, a negative voltage is applied to the electrode plate 196A and a positive voltage is applied to the electrode plate 196B, which in turn generates an electric field in the upward direction A4, such that the fuel droplets 312 and the satellite droplets 314 in the electric field can be deflected by the force 310 along the downward direction A4. In this way, since the droplet deflector 194a can apply the force 310 along the direction A4 away from the collector 110, it can deflect the satellite droplets 314 away from the collector 110. In some embodiments, the electrode plates 196A and 196B are symmetric about the droplet path 131. In other embodiments, the electrode plates 196A and 196B are asymmetric about the droplet path 131. For example, the electrode plate 196A may be further away from the droplet path 131 than the electrode plate 196B, so as to avoid the fuel droplets 312 and the satellite droplets 314 from hitting the electrode plate 196A.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the satellite droplets can be deflected away from the excitation zone, which in turn will reduce shock waves resulting from excitation of the satellite droplets, which in turn will prevent acceleration of the fuel droplets in the excitation zone, thus preventing the fuel droplets from incomplete excitation.

According to various embodiments of the present disclosure, a method is provided. The method includes steps as follows. A primary droplet and a satellite droplet are shot toward an excitation zone. The satellite droplet is deflected away from the excitation zone. A laser beam is emitted toward the excitation zone to excite the primary droplet to generate an extreme ultraviolet (EUV) light. The EUV light is directed onto a reticle using a first optical reflector, such that the EUV light is imparted with a pattern of the reticle. The EUV light with the pattern is directed onto a wafer using a second optical reflector.

According to various embodiments of the present disclosure, a method is provided. The method includes steps as follows. A first droplet and a second droplet are shot along a same initial path, and the second droplet has a lighter weight than the first droplet. A force is applied on the first and second droplets, such that the first and second droplets respectively move along a first path and a second path different the first path. A laser beam is emitted to the first droplet on the first path to generate an extreme ultraviolet (EUV) light. The EUV light is directed onto a reticle using a first optical reflector, such that the EUV light is imparted with a pattern of the reticle. The EUV light with the pattern is directed onto a wafer using a second optical reflector.

According to various embodiments of the present disclosure, a lithography system includes a collector, a laser generator, a droplet generator, and a droplet deflector. The collector has a mirror surface. The laser generator aims at an excitation zone in front of the mirror surface of the collector. The droplet deflector is operative to apply a force at a position between the droplet generator and the excitation zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   shooting a primary droplet and a satellite droplet from a droplet generator toward an excitation zone;
   applying a soundwave to deflect the satellite droplet away from the excitation zone;
   emitting a laser beam toward the excitation zone to excite the primary droplet to generate an extreme ultraviolet (EUV) light;
   directing the EUV light onto a reticle using a first optical reflector, such that the EUV light is imparted with a pattern of the reticle;
   directing the EUV light with the pattern onto a wafer using a second optical reflector;
   halting shooting the primary droplet and the satellite droplet after applying the soundwave to deflect the satellite droplet; and
   halting applying the soundwave after halting shooting the primary droplet and the satellite droplet.

2. The method of claim 1, wherein emitting the laser beam is performed such that the deflected satellite droplet is not excited by the laser beam.

3. The method of claim 1, wherein deflecting the satellite droplet is performed such that the primary droplet is deflected.

4. The method of claim 3, wherein the primary droplet is deflected by a first distance, and the satellite droplet is deflected by a second distance greater than the first distance.

5. The method of claim 1, wherein the primary droplet and the satellite droplet are shot out from the droplet generator along an initial path, and the soundwave is applied on the initial path.

6. The method of claim 1, further comprising:
halting emitting the laser beam before halting applying the soundwave.

7. The method of claim 1, wherein the laser beam is emitted along a direction opposite a direction of the soundwave.

8. The method of claim 1, wherein the laser beam is emitted from a back side of a collector to a front side of collector, and the satellite droplet is deflected toward the back side of the collector.

9. The method of claim 1, further comprising providing a continuous gas flow through a chamber for generating the EUV light after applying the soundwave and prior to halting applying the soundwave.

10. The method of claim 1, further comprising providing a continuous gas flow through a chamber for generating the EUV light prior to halting shooting the primary droplet and the satellite droplet and halting applying the soundwave.

11. A method, comprising:
shooting a first droplet and a second droplet along a same initial path, the second droplet having a lighter weight than the first droplet;
applying a soundwave on the first and second droplets, such that the first and second droplets respectively move along a first path and a second path different from the first path;
emitting a laser beam to the first droplet on the first path to generate an extreme ultraviolet (EUV) light;
directing the EUV light onto a reticle using a first optical reflector, such that the EUV light is imparted with a pattern of the reticle; and
directing the EUV light with the pattern onto a wafer using a second optical reflector.

12. The method of claim 11, wherein the laser beam is not incident on the second droplet during emitting the laser beam to the first droplet.

13. The method of claim 11, further comprising:
catching the first and second droplets using different droplet catchers, respectively.

14. The method of claim 11, wherein a traveling path of the soundwave intersects with the initial path of the first droplet and the second droplet.

15. A method, comprising:
shooting primary droplets and satellite droplets from a droplet generator;
applying a soundwave to the primary droplets and the satellite droplets, such that the primary droplets are directed toward an excitation zone, while the satellite droplets are directed to a first droplet catcher away from the excitation zone;
emitting a laser beam, through a collector, toward the excitation zone to excite the primary droplets to generate an extreme ultraviolet (EUV) light;
halting shooting the primary droplets and the satellite droplets after applying the soundwave; and
halting applying the soundwave after halting shooting the primary droplets and the satellite droplets.

16. The method of claim 15, further comprising receiving un-excited portions of the primary droplets by a second droplet catcher, wherein the second droplet catcher is misaligned with the droplet generator.

17. The method of claim 16, wherein a vertical distance between an outlet of the droplet generator and an entrance of the second droplet catcher is less than a vertical distance between the outlet of the droplet generator and an entrance of the first droplet catcher.

18. The method of claim 15, wherein the satellite droplets are received by the first droplet catcher prior to reaching the excitation zone.

19. The method of claim 15, wherein the first droplet catcher is disposed on a backside of the collector.

20. The method of claim 15, wherein applying the soundwave to the primary droplets and the satellite droplets comprises generating a wave or an airflow to the primary droplets and the satellite droplets.

* * * * *